United States Patent
Kenny et al.

(10) Patent No.: US 7,173,495 B1
(45) Date of Patent: Feb. 6, 2007

(54) REDUNDANT BACK-UP PLL OSCILLATOR PHASE-LOCKED TO PRIMARY OSCILLATOR WITH FAIL-OVER TO BACK-UP OSCILLATOR WITHOUT A THIRD OSCILLATOR

(75) Inventors: David J. Kenny, State College, PA (US); Kyusun Choi, State College, PA (US)

(73) Assignee: Pericom Semiconductor Corp, San Jose, CA (US)

( * ) Notice: Subject to any disclaimer, the term of this patent is extended or adjusted under 35 U.S.C. 154(b) by 49 days.

(21) Appl. No.: 10/907,558

(22) Filed: Apr. 5, 2005

(51) Int. Cl.
*H03B 5/12* (2006.01)

(52) U.S. Cl. .............. 331/49; 331/2; 331/47; 327/20; 327/294

(58) Field of Classification Search .......... 331/49, 331/2, 47; 327/20, 294
See application file for complete search history.

(56) References Cited

U.S. PATENT DOCUMENTS

| | | | | |
|---|---|---|---|---|
| 4,254,492 | A * | 3/1981 | McDermott, III | 368/119 |
| 5,059,925 | A | 10/1991 | Weisbloom | 331/1 A |
| 5,648,964 | A | 7/1997 | Inagaki et al. | 370/228 |
| 5,774,705 | A | 6/1998 | Leshem | 713/501 |
| 5,852,728 | A | 12/1998 | Matsuda et al. | 713/501 |
| 5,943,382 | A | 8/1999 | Li et al. | 375/376 |
| 6,194,969 | B1 | 2/2001 | Doblar | 331/2 |
| 6,239,626 | B1 * | 5/2001 | Chesavage | 327/99 |
| 6,341,149 | B1 | 1/2002 | Bertacchini et al. | 375/356 |
| 6,411,143 | B1 | 6/2002 | Fernandez-Texon | 327/156 |
| 6,516,422 | B1 | 2/2003 | Doblar et al. | 713/503 |
| 2004/0158759 | A1 | 8/2004 | Chang et al. | 713/500 |

\* cited by examiner

*Primary Examiner*—Robert Pascal
*Assistant Examiner*—Levi Gannon
(74) *Attorney, Agent, or Firm*—g Patent L.L.C.; Stuart T. Auvinen

(57) ABSTRACT

A redundant-source clock generator has only two oscillators, rather than three oscillators. A secondary oscillator is phase-locked to a primary clock from a primary oscillator using a phase detector, charge pump, and filter that generate a control voltage to the secondary oscillator that determine the frequency of a secondary clock. The primary clock is compared to the secondary clock to detect primary clock failure. When clock failure is detected, a mux is switched to select a delayed secondary clock rather than a delayed primary clock to output as a system clock. Since the mux receives delayed clock signals, clock-failure detection has additional time to detect the clock failure before the clock failure is propagated through the mux. When the primary oscillator fails and the clock failure is detected, the phase detector stops comparing a feedback secondary clock to the primary clock and instead holds the control voltage steady.

18 Claims, 4 Drawing Sheets

REDUNDANT BACK-UP PLL OSCILLATOR PHASE-LOCKED TO PRIMARY OSCILLATOR WITH FAIL-OVER TO BACK-UP OSCILLATOR WITHOUT A THIRD OSCILLATOR

FIELD OF THE INVENTION

This invention relates to synchronous digital systems, and more particularly to redundant clock sources with fail-over.

BACKGROUND OF THE INVENTION

Digital systems often rely on precise clocks for advancing states and data pipelines. Such precise clocks can be generated using crystal oscillators such as from a vibrating quartz crystal. The oscillating signal from the crystal can be applied to a phase-locked loop (PLL) to further refine the clock signal by reducing jitter and cycle-to-cycle variations.

Since clocks are so vital to many digital systems, a back-up or redundant oscillator may be used to supply a back-up clock in case of a failure of the primary oscillator. FIG. 1 shows a prior-art redundant clock source. Primary oscillator 10 generates a primary clock signal that is input to muxes 12, 22. Secondary oscillator 20 generates a second clock signal that is also input to muxes 12, 22.

In lock detector 62, phase detector 14 compares phases of the clock selected by mux 12 to the feedback clock from flip-flop 18. Phase mis-matches cause a voltage applied to a voltage-controlled oscillator (VCO) to vary. Third VCO 16 receives the phase-varying voltage from phase detector 14 and generates a clock that varies in frequency with the input voltage. The clock from third VCO 16 is input to flip-flop 18 to generate a clock that can be used by a system.

A second lock detector may also be present, although it is not always required. In second lock detector 64, phase detector 24 compares phases of the clock selected by mux 22 to the feedback clock from flip-flop 28. Fourth VCO 26 receives the phase-varying voltage from phase detector 24 and generates a clock that varies in frequency with the input voltage. The clock from fourth VCO 26 is input to flip-flop 28 to generate a clock that can be used by a system.

Control logic 70 can receive a clock-select signal from a system, or can be informed when a clock failure occurs. Control logic 70 then causes muxes 12, 22 to select the other clock source, such as the second clock from secondary oscillator 20 rather than the first clock from primary oscillator 10. Control logic 70 may be able to detect a clock failure by examining the varying voltages from phase detectors 14, 24, and may then switch clock sources.

While having a back-up clock source is useful, several oscillators may be needed by clock pulse generator 36. For example, at least 3 oscillators are needed. Two crystal oscillators are needed for primary oscillator 10 and for secondary oscillator 20, while a third oscillator is needed for third VCO 16, which locks to either primary oscillator 10 or to secondary oscillator 20.

When primary oscillator 10 fails, control logic 70 switches mux 12 to secondary oscillator 20. Since the varying voltage from phase detector 14 may take some time to decay, third VCO 16 can continue oscillating to generate the system clock when primary oscillator 10 fails and control logic 70 switches over mux 12 to secondary oscillator 20.

Oscillators can draw significant power and occupy a significant die or board area and can add to the expense of a system. Having three oscillators for the redundant clock generator is somewhat undesirable. It is preferable to have only 2 oscillators rather than 3 oscillators.

What is desired is a redundant clock generator that can switch-over to a back-up oscillator upon failure of a primary oscillator. A redundant clock generator that has only 2 oscillators is desirable.

DETAILED DESCRIPTION

The present invention relates to an improvement in redundant clock sources. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a redundant clock generator can be constructed from only 2 oscillators and thus eliminate the expense of a third oscillator. A secondary oscillator can lock to a primary oscillator. A multiplexer can select delayed clocks from among the two oscillators. Clock-failure detection can detect failures on the pre-delayed oscillator clocks, allowing time for clock switching when failures occur.

Figure 1:
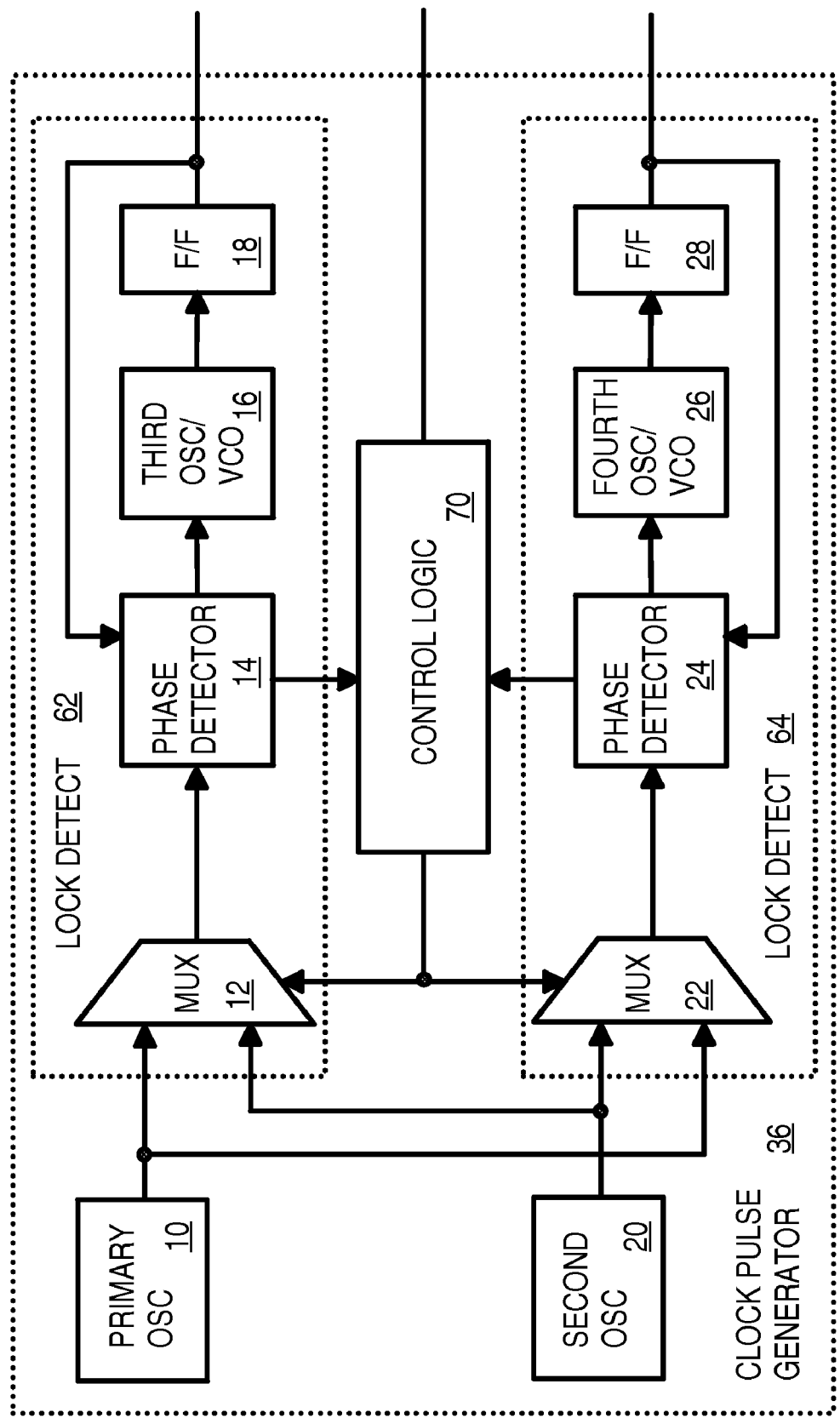
FIG. 1 shows a prior-art redundant clock source.
Figure 2:
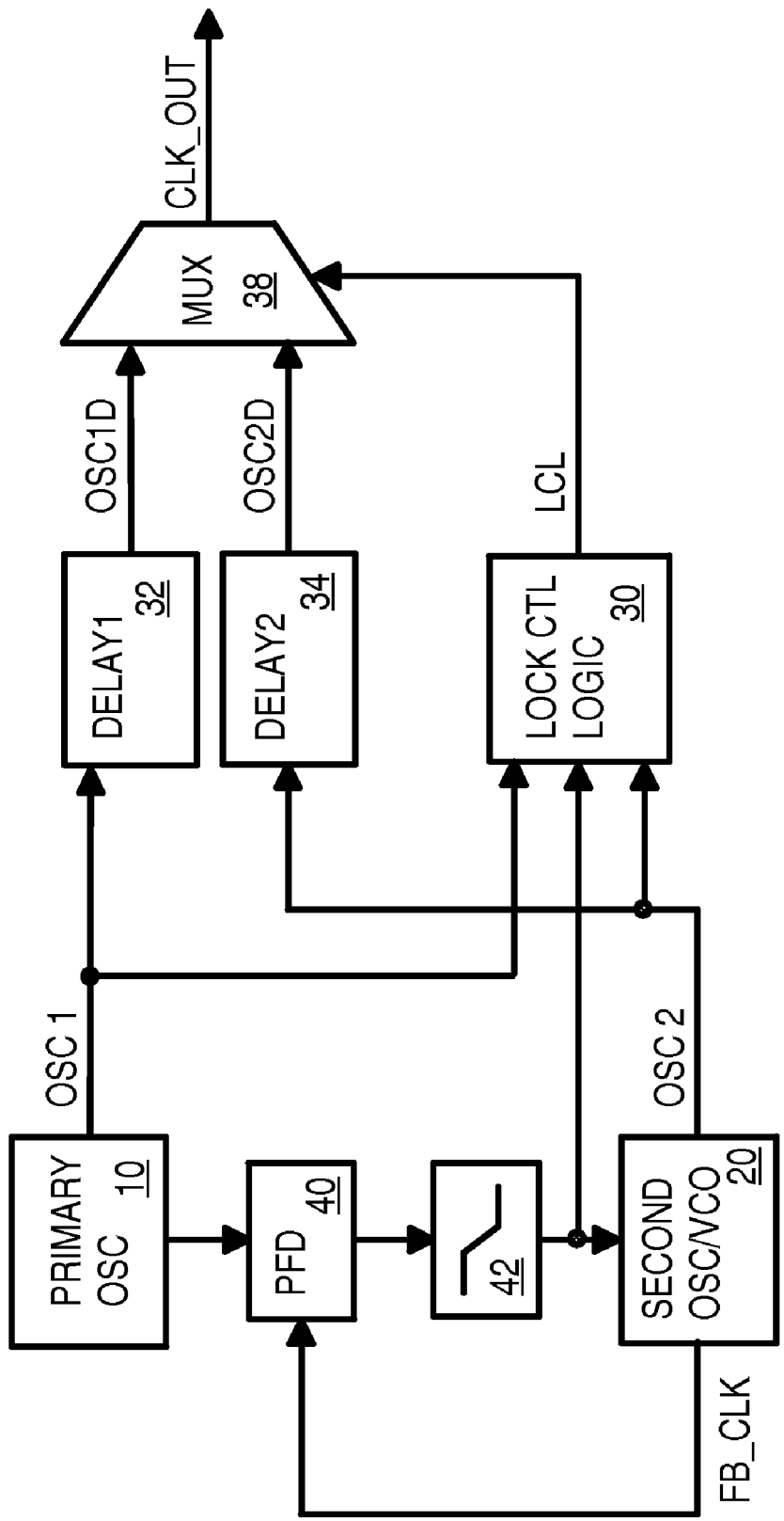
FIG. 2 is a block diagram of a redundant clock generator with only two oscillators.

FIG. 2 is a block diagram of a redundant clock generator with only two oscillators. Primary oscillator 10 generates a clock that normally is the clock source for a system clock that is derived from output clock CLK_OUT. However, when primary oscillator 10 fails, secondary oscillator 20 becomes the clock source for output clock CLK_OUT.

During normal operation, when primary oscillator 10 is operating normally, secondary oscillator 20 is phase and frequency locked to primary oscillator 10. Secondary oscillator 20 can be a voltage-controlled oscillator (VCO) in a Phase-locked loop (PLL) that has an input clock that is either derived from primary oscillator 10 or is directly output by primary oscillator 10.

The primary clock from primary oscillator 10 is input to phase detector 40, which can be a phase and frequency detector rather than just a phase detector. A feedback clock FB_CLK from secondary oscillator 20 is also input to phase detector 40, and the primary clock from primary oscillator 10 is phase and frequency compared to the feedback clock from secondary oscillator 20. A charge pump can be activated when a phase mismatch is detected by phase detector 40. The charge pump increases or decreases charge stored on filter 42 in response to these phase mismatches detected by phase detector 40.

Filter 42 can be a capacitor that stores charge that is adjusted by a charge pump in phase detector 40. Filter 42 may be as simple as a capacitor to ground or to another fixed voltage, or may include a series resistor to the capacitor, or may be a more complex circuit of one or more resistors and capacitors.

Filter 42 generates an output voltage that varies as charge is added to or removed from a capacitance in filter 42 in response to phase mismatches detected by phase detector 40. The filter output voltage is input to secondary oscillator 20 as a control voltage which changes the frequency of oscillation of secondary oscillator 20.

For example, a ring oscillator can have series transistors between stages that act as variable resistors when the control voltage is applied to the gates of the series transistors. The series transistors could also be within a stage, such as between p-channel and n-channel transistors in an inverting stage. The control voltage could also adjust the pseudo-power-supply voltage applied to the stages.

Lock control logic 30 receives the primary clock from primary oscillator 10, and the secondary clock from secondary oscillator 20, and compares the two clocks to detect when the primary clock fails. For example, the primary clock may be stuck high or may be stuck low, and lock control logic 30 can detect these failures of the primary clock. More complex failures may also be detected by lock control logic 30, such as when the frequency of the primary clock drops or when primary-clock pulses are skipped.

When a failure in the primary clock is detected, lock control logic 30 activates lock control signals LCL, which causes mux 38 to select its other input. Mux 38 receives a delayed primary clock, OSC1D, from delay line 32, and a delayed secondary clock, OSC2D, from delay line 34. Delay line 32 has the primary clock from primary oscillator 10 as its input, and delays the primary clock by about 1.5 clock periods. Delay line 34 has the secondary clock from secondary oscillator 20 as its input, and delays the secondary clock by about 1.5 clock periods.

Lock control logic 30 receives the primary and secondary clocks before delay lines 32, 34, and may detect clock failure before the failure is propagated through delay line 32. Lock control signal LCL can switch mux 38 before the failure reaches output clock CLK_OUT, or at least before many clock periods of failure have occurred. This minimizes the effect any clock failure has on downstream logic.

When lock control logic 30 activates LCL, mux 38 outputs the delayed secondary clock from secondary oscillator 20 and stops outputting the delayed primary clock. Thus the clock source is switched when a failure is detected by lock control logic 30.

When a clock failure is detected, secondary oscillator 20 must become unlocked from primary oscillator 10. The LCL signal can be applied to phase detector 40, causing phase detector 40 to be disabled. Phase comparisons stop, or the charge pump can be disabled from adding or removing charge from filter 42. Then the previously stored charge on filter 42 remains, keeping the control voltage to secondary oscillator 20 relatively constant. Low-leakage capacitors and circuits may be used for filter 42, or a holding circuit may be employed to prevent the control voltage from decaying over long periods of time.

A holding circuit could be used rather than a capacitor. An Analog-to-Digital (ADC) and a digital-to-analog converter (DAC) could be used with appropriate control circuitry to hold the output voltage constant. A digital-value register driven by the ADC and driving the DAC stores the digital voltage value. A digital potentiometer could also be used in place of the DAC.

Figure 3:
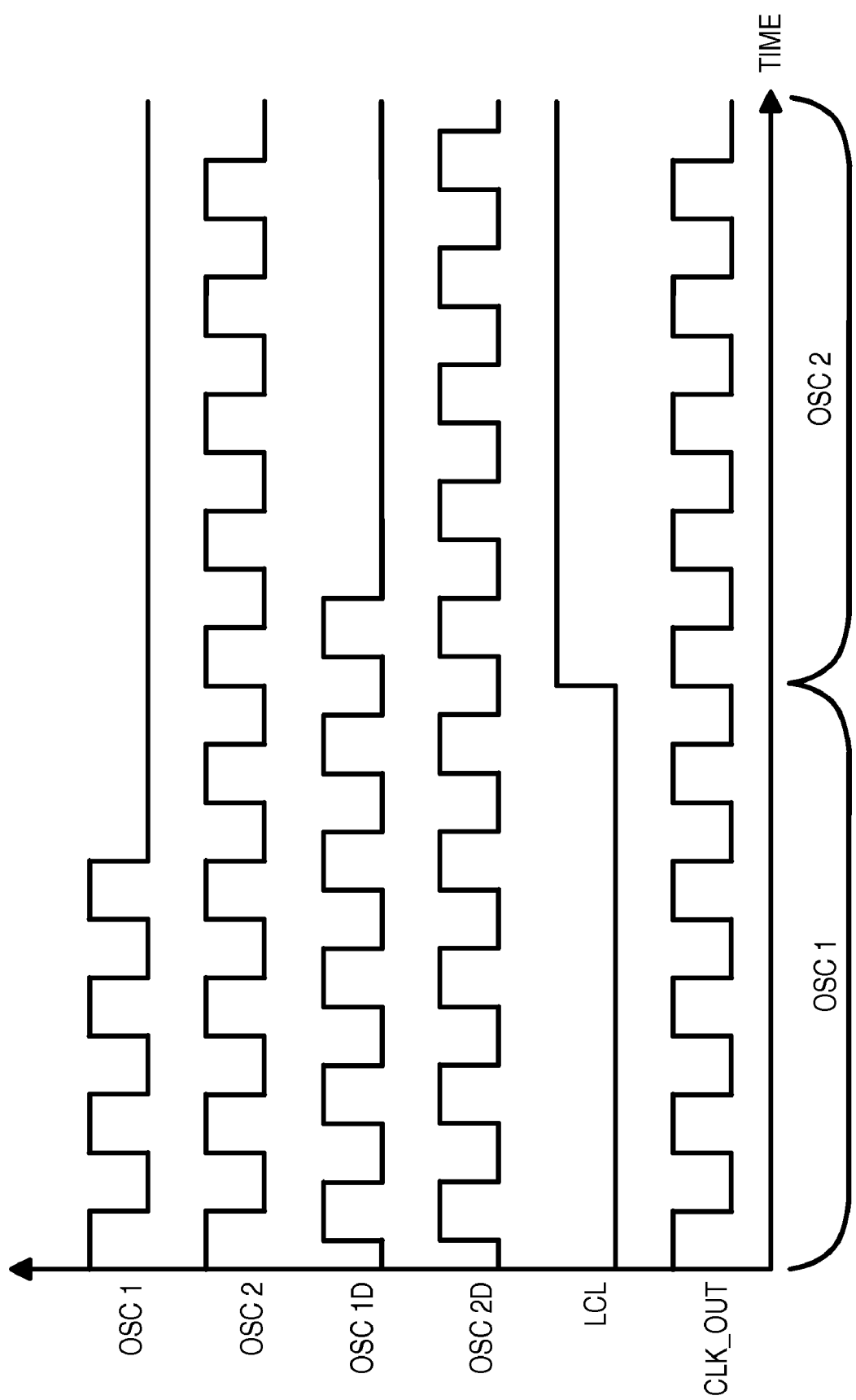
FIG. 3 is a waveform of operation of the redundant clock-source circuit of FIG. 2.

FIG. 3 is a waveform of operation of the redundant clock-source circuit of FIG. 2. OSC1 from the primary oscillator is free running and delayed to generated OSC1D, which is selected by the mux to be the output clock CLK_OUT, since lock control signals LCL is low (inactive). The secondary oscillator is phase-locked to the primary oscillator, so secondary clock OSC2 and its delayed versions, OSC2D follow primary clock OSC1.

After a period of time, the primary oscillator fails. OSC1 becomes stuck low. After a delay of 2 or more clock periods OSC1D also becomes stuck low. However, the lock control logic detects the failure in OSC1 within 1.5 clock periods and generates LCL high by the time the failure propagates through to OSC1D. LCL switches the mux to select OSC2D as the input to generate CLK_OUT. No failure occurs in the output clock, since the clock source was switched from the primary oscillator to the secondary oscillator before the failure propagated through to the output clock.

Figure 4:
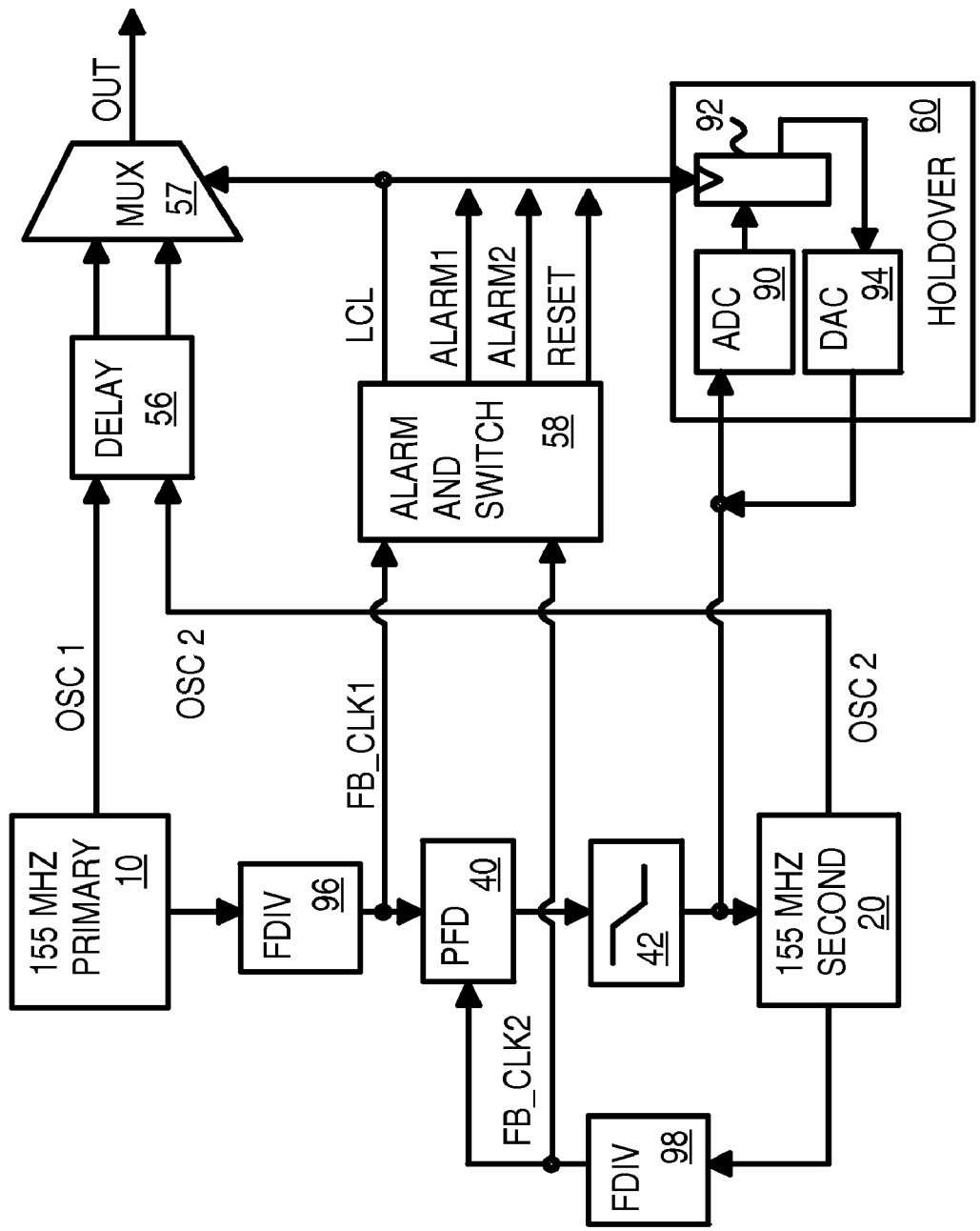
FIG. 4 is a block diagram of a redundant clock generator with only two oscillators and holdover and alarm circuits.

FIG. 4 is a block diagram of a redundant clock generator with only two oscillators and holdover and alarm circuits. Primary oscillator 10 generates a 155 MHz clock that normally is the clock source for a system clock that is derived from output clock OUT. However, when primary oscillator 10 fails, secondary oscillator 20 becomes the clock source for output clock OUT.

During normal operation, when primary oscillator 10 is operating normally, secondary oscillator 20 is phase and frequency locked to primary oscillator 10 by phase detector 40 and filter 42, which generates a control voltage to a VCO ins secondary oscillator 20 as described earlier.

Holdover circuit 60 is activated when failure of primary oscillator 10 is detected. Holdover circuit 60 compensates for any leakage in filter 42 to maintain a stable control voltage to secondary oscillator 20. This keeps the frequency of secondary oscillator 20 steady at about 155 MHz.

Holdover circuit 60 includes ADC 90 that converts the analog voltage input of secondary oscillator 20 into a digital value, which is latched by register 92 when LCL goes high when a failure of OSC1 is detected by alarm circuit 58. Register 92 drives the digital input of DAC 94, which generates an analog holding voltage back to the input of secondary oscillator 20. Filter 42 may be a simple capacitor or may be deleted.

Alarm circuit 58 receives the primary clock from primary oscillator 10, and the secondary clock from secondary oscillator 20, and compares the two clocks to detect when the primary clock fails, driving LCL high to mux 57 and register 92. For example, the primary clock may be stuck high or may be stuck low, or the frequency of the primary clock may drop or pulses are skipped. Alarm signal ALARM1 is activated when the primary clock fails, while ALARM2 is activated when a failure of the secondary clock is detected. A reset signal may also be generated to reset the system after a clock failure of both clocks.

Delay 56 delays both the primary and secondary clocks and inputs them to mux 57. Mux 57 is controlled by LCL from alarm circuit 58 and switches to select the delayed secondary clock when a failure in the primary clock is detected. When a failure in the secondary clock is detected, and the primary clock has recovered and is working properly, mux 57 can be switched back to the primary clock.

Divider 96 divides OSC1 to generate FB_CLK_1, which is input to alarm circuit 58 and to phase detector 40. Divider 98 divides OSC2 to generate FB_CLK_2, which is also input to alarm circuit 58 and to phase detector 40. Thus divided feedback clocks can be used within the loops, and for clock-failure detection.

Switching from OSC2 back to OSC1 could have a small frequency perturbation. The architecture can be modified to bring the primary oscillator back with no perturbation. A secondary loop can be added with the secondary source acting as the primary. This loop remains inactive until control logic establishes a switch to the secondary source. Another holdover circuit could be utilized to align the clocks. This approach may require that both primary and secondary sources be voltage controllable and may require more complex control logic.

ALTERNATE EMBODIMENTS

Several other embodiments are contemplated by the inventors. For example the clock-failure detector can be implemented in a variety of ways, such as with combinatorial logic gates, flip-flops, latches, state machines, etc. Clock dividers can optionally be inserted at various locations, such as in the feedback path to the phase detector. Inverting and buffer of clocks can be added at various places, and clocks can be split and sent to two or more destinations, yet be derived from the same clock or considered to be the same clock. Operating frequencies other than 155 MHz can be substituted.

Rather than delay both clocks before the mux, just the primary clock could be delayed while the secondary clock is not delayed.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A dual-oscillator clock generator comprising:
a primary oscillator that generates a primary clock operating at a primary frequency;
a secondary oscillator that generates a secondary clock having a secondary frequency determined by a control voltage;
a phase detector that receives the primary clock or a derivative of the primary clock as a first input clock and the secondary clock or a derivative of the secondary clock as a second input clock, the phase detector comparing phases of the first input clock and the second input clock;
a holding circuit that determines the control voltage to the secondary oscillator, an input to the holding circuit being charged and discharged by the phase detector in response to phase comparison of the first and second input clocks;
a first delay circuit, receiving the primary clock and generating a delayed primary clock;
a second delay circuit, receiving the secondary clock and generating a delayed secondary clock;
a multiplexer, receiving the delayed primary clock from the first delay circuit, and receiving the delayed secondary clock from the second delay circuit, and receiving a select signal, for outputting the delayed primary clock as an output clock when the select signal is in a first state, and for outputting the delayed secondary clock as the output clock when the select signal is in a second state; and
a clock-failure detector, receiving the primary clock and receiving the secondary clock, for detecting a clock failure when the primary clock is not pulsing while the secondary clock is pulsing, the clock-failure detector generating the select signal in the second state when the clock failure is detected,
whereby the multiplexer selects the delayed secondary clock when the clock failure is detected.

2. The dual-oscillator clock generator of claim 1 wherein the phase detector is disabled from charging and discharging the holding circuit when the clock-failure detector detects the clock failure, and wherein the holding circuit comprises an analog-to-digital converter, a digital latch for latching an output of the analog-to-digital converter, and a digital-to-analog converter (DAC) driven by the digital latch.

3. The dual-oscillator clock generator of claim 2 wherein the phase detector further comprises a charge pump for charging and discharging the input to the holding circuit in response to phase differences between the first and second input clocks that are detected by the phase detector.

4. The dual-oscillator clock generator of claim 3 wherein the phase detector is a phase and frequency detector that detects frequency differences and phase differences between the first and second input clocks.

5. The dual-oscillator clock generator of claim 4 wherein the holding circuit is activated by the select signal being in the second state when a clock failure is detected by the clock-failure detector, the holding circuit for maintaining the control voltage at a constant voltage when the primary oscillator fails.

6. The dual-oscillator clock generator of claim 3 further comprising:
an alarm signal generated by the clock-failure detector when the select signal is in the second state.

7. The dual-oscillator clock generator of claim 3 wherein the secondary clock is fed back to the phase detector as the second input clock.

8. The dual-oscillator clock generator of claim 3 wherein the secondary clock is input to a feedback divider that generates the second input clock to the phase detector.

9. The dual-oscillator clock generator of claim 3 wherein the clock-failure detector detects the clock failure within 2 clock periods.

10. The dual-oscillator clock generator of claim 3 wherein the first delay circuit has a delay of less than a detection delay of the clock-failure detector to detect a clock failure.

11. The dual-oscillator clock generator of claim 3 wherein the first delay circuit and the second delay circuit have delay values that are about a same value.

12. The dual-oscillator clock generator of claim 3 wherein the dual-oscillator clock generator has exactly two oscillators.

13. A fail-over clock circuit comprising:
primary oscillator means for generating a primary clock at a primary frequency;
secondary oscillator means for generating a secondary clock at the primary frequency;
filter means for storing charge to generate a control voltage to the secondary oscillator means, the control voltage determining a frequency of oscillation of the secondary clock;
phase detector means for comparing phases of a primary input clock and a secondary input clock and for charging and discharging the filter means in response to phase comparison;
wherein the primary input clock is the primary clock or a derivative of the primary clock;
wherein the secondary input clock is the secondary clock or a derivative of the secondary clock;
first delay means, receiving the primary clock, for generating a delayed primary clock;
second delay means, receiving the secondary clock, for generating a delayed secondary clock;
mux means, receiving a select signal, for outputting the delayed primary clock or the delayed secondary clock as an output clock in response to the select signal; and
failure detect means, receiving the primary clock and the secondary clock, for detecting a clock failure when the primary clock is not pulsing but the secondary clock is pulsing;
holding circuit means for maintaining the control voltage relatively constant in response to the failure detect means detecting the clock failure;
wherein the failure detect means is further for outputting the select signal to the mux means, the select signal causing the mux means to select the delayed secondary clock when the failure detect means detects the clock failure,
whereby the secondary clock is output when the primary clock fails.

14. The fail-over clock circuit of claim 13 further comprising:
alarm means, coupled to the failure detect means, for generating an alarm signal when the clock failure is detected.

15. A fail-over clock circuit comprising:
primary oscillator means for generating a primary clock at a primary frequency;
secondary oscillator means for generating a secondary clock at the primary frequency;
filter means for storing charge to generate a control voltage to the secondary oscillator means, the control voltage determining a frequency of oscillation of the secondary clock;
phase detector means for comparing phases of a primary input clock and a secondary input clock and for charging and discharging the filter means in response to phase comparison;
wherein the primary input clock is the primary clock or a derivative of the primary clock;
wherein the secondary input clock is the secondary clock or a derivative of the secondary clock;
first delay means, receiving the primary clock, for generating a delayed primary clock;
second delay means, receiving the secondary clock, for generating a delayed secondary clock;
mux means, receiving a select signal, for outputting the delayed primary clock or the delayed secondary clock as an output clock in response to the select signal; and
failure detect means, receiving the primary clock and the secondary clock, for detecting a clock failure when the primary clock is not pulsing but the secondary clock is pulsing,
wherein the first delay means delays the primary clock by a delay time;
wherein the failure detect means detects the clock failure in a detect time;
wherein the detect time is less than the delay time;
whereby the secondary clock is output when the primary clock fails.

16. The fail-over clock circuit of claim 15 wherein the fail-over clock circuit contains no other oscillators to generate the output clock.

17. A clock generator comprising:
a first oscillator that operates at a first frequency and generates a first clock;
a second oscillator that nominally operates at the first frequency and generates a second clock;
a first input clock that is the first clock or is generated from the first clock;
a feedback clock that is the second clock or is generated from the second clock;
a capacitor that generates a control voltage to the second oscillator;
a phase detector that receives the first input clock and the feedback clock and adjusts the control voltage of the capacitor in response to phase comparisons;
a first pre-delay clock that is the first clock or is generated from the first clock;
a first delay circuit that receives the first pre-delay clock and generates a delayed first clock that is delayed by a first delay;
a second pre-delay clock that is the second clock or is generated from the second clock;
a second delay circuit that receives the second pre-delay clock and generates a delayed second clock that is delayed by the first delay;
a clock selector that outputs the delayed first clock or the delayed second clock in response to a failure signal;
a first detect clock that is the first clock or is generated from the first clock;
a second detect clock that is the second clock or is generated from the second clock;
a failure detector that generates the failure signal when the first detect clock is not pulsing and the second detect clock is pulsing; and
a holding circuit, coupled to the control voltage, for maintaining the control voltage when the failure signal is generated;
wherein the second oscillator is a voltage-controlled oscillator (VCO) having a frequency controlled by the control voltage from the capacitor.

18. A clock generator comprising:
a first oscillator that operates at a first frequency and generates a first clock;
a second oscillator that nominally operates at the first frequency and generates a second
a first input clock that is the first clock or is generated from the first clock; clock;
a feedback clock that is the second clock or is generated from the second clock;
a capacitor that generates a control voltage to the second oscillator;
a phase detector that receives the first input clock and the feedback clock and adjusts the control voltage of the capacitor in response to phase comparisons;

a first pre-delay clock that is the first clock or is generated from the first clock;

a first delay circuit that receives the first pre-delay clock and generates a delayed first clock that is delayed by a first delay;

a second pre-delay clock that is the second clock or is generated from the second clock;

a second delay circuit that receives the second pre-delay clock and generates a delayed second clock that is delayed by the first delay;

a clock selector that outputs the delayed first clock or the delayed second clock in response to a failure signal;

a first detect clock that is the first clock or is generated from the first clock;

a second detect clock that is the second clock or is generated from the second clock; and a failure detector that generates the failure signal when the first detect clock is not pulsing and the second detect clock is pulsing;

wherein the failure detector generates the failure signal before the first delay.

\* \* \* \* \*